(12) United States Patent
Ebine et al.

(10) Patent No.: US 10,304,655 B2
(45) Date of Patent: May 28, 2019

(54) CHARGED PARTICLE BEAM DEVICE AND EVACUATION METHOD FOR SAME

(71) Applicant: Hitachi High-Technologies Corporation, Minato-ku, Tokyo (JP)

(72) Inventors: Yuuta Ebine, Tokyo (JP); Mitsuo Akatsu, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 15/565,214

(22) PCT Filed: Apr. 15, 2015

(86) PCT No.: PCT/JP2015/061543
§ 371 (c)(1),
(2) Date: Oct. 9, 2017

(87) PCT Pub. No.: WO2016/166825
PCT Pub. Date: Oct. 20, 2016

(65) Prior Publication Data
US 2018/0082819 A1 Mar. 22, 2018

(51) Int. Cl.
*H01J 37/18* (2006.01)
*H01J 37/16* (2006.01)
*H01J 37/28* (2006.01)

(52) U.S. Cl.
CPC .............. *H01J 37/18* (2013.01); *H01J 37/16* (2013.01); *H01J 37/28* (2013.01); *H01J 2237/18* (2013.01);
(Continued)

(58) Field of Classification Search
None
See application file for complete search history.

(56) References Cited

U.S. PATENT DOCUMENTS 4,889,995 A * 12/1989 Tsutsumi ............... H01J 37/18
250/440.11
2004/0076529 A1    4/2004 Gnauck et al.
(Continued)

FOREIGN PATENT DOCUMENTS

CN      103477415 A    12/2013
JP      2004-503063 A   1/2004
(Continued)

OTHER PUBLICATIONS

Thiberge et al. "Scanning electron microscopy of cells and tissues under fully hydrated conditions", Proceedings of the National Academy of Sciences, 101 (10) 3346-3351 (Mar. 2004).*
(Continued)

*Primary Examiner* — James Choi
(74) *Attorney, Agent, or Firm* — Crowell & Moring LLP

(57) ABSTRACT

In this charged particle beam device, when a sample chamber is to be placed in a high-vacuum state, a charged particle gun chamber and the sample chamber are evacuated via a main intake of a turbo molecular pump, and when the sample chamber is to be placed in a low-vacuum state, the sample chamber is evacuated via an intermediate intake of the turbo molecular pump while the charged particle gun chamber is evacuated via the main intake. An oil rotation pump for performing back pressure exhausting of the turbo molecular pump does not directly evacuate the charged particle gun chamber or the sample chamber. It is thereby possible to minimize contamination of the device interior in both high-vacuum and low-vacuum states, which makes it possible to prevent contamination of the observed sample and reduce deterioration over time in the ultimate vacuum.

16 Claims, 6 Drawing Sheets

(52) U.S. Cl.
    CPC . *H01J 2237/186* (2013.01); *H01J 2237/1825* (2013.01)

(56) References Cited

U.S. PATENT DOCUMENTS

| | | | |
|---|---|---|---|
| 2014/0021347 A1 | | 1/2014 | Ominami et al. |
| 2015/0137001 A1* | | 5/2015 | Hiroki .................... H01J 37/18 250/441.11 |

FOREIGN PATENT DOCUMENTS

| | | | | |
|---|---|---|---|---|
| JP | 2007-141633 A | | | 6/2007 |
| JP | 2011-34744 A | | | 2/2011 |
| JP | 2011034744 A | * | | 2/2011 |
| JP | 2012-160384 A | | | 8/2012 |
| JP | 2012-221766 A | | | 11/2012 |

OTHER PUBLICATIONS

International Search Report (PCT/ISA/210) issued in PCT Application No. PCT/JP2015/061543 dated Jul. 7, 2015 with English translation (10 pages).

Japanese-language Written Opinion (PCT/ISA/237) issued in PCT Application No. PCT/JP2015/061543 dated Jul. 7, 2015 (seven pages).

Chinese-language Office Action issued in counterpart Chinese Application No. 201580078052.3 dated Aug. 28, 2018 with English translation (21 pages).

Japanese-language Office Action issued in counterpart Japanese Application No. 2017-512504 dated Jul. 10, 2018 with English translation (fourteen (14) pages).

\* cited by examiner

CHARGED PARTICLE BEAM DEVICE AND EVACUATION METHOD FOR SAME

TECHNICAL FIELD

The present invention relates to a charged particle beam apparatus capable of performing high-vacuum exhaust and low-vacuum exhaust.

BACKGROUND ART

As a charged particle beam apparatus capable of performing high-vacuum exhaust and low-vacuum exhaust, for example, there is a low-vacuum scanning electron microscope including a vacuum exhaust system disclosed in the following patent literature.

JP-A-2007-141633 (PTL 1) discloses a vacuum exhaust system that is capable of performing high-vacuum exhaust and low-vacuum exhaust of an electron gun chamber using minimum pumps and that has a configuration including a first pump (a turbo molecular pump) performing high-vacuum exhaust of the electron gun chamber and a second pump (an oil rotary pump) performing back pressure exhaust of the first pump and low-vacuum exhaust of a sample chamber as well.

JP-A-2011-034744 (PTL 2) discloses an exhaust system that includes a plurality of intermediate chambers through which electron rays pass between an electron gun chamber and a sample chamber, includes valves in openings between the plurality of intermediate chambers, and performs exhaust so that pressures of the intermediate chamber closer to the sample chamber than the value and the sample chamber are higher than pressures of the intermediate chamber closer to the electron source than the valve and the electron gun chamber in order to achieve an improvement in a throughput from sample exchange to observation since it is general to expose the sample chamber, the intermediate chambers, and the electron gun chamber to the atmosphere at the time of exchanging a sample in the low-vacuum scanning electron microscope of PTL 1 or the like.

CITATION LIST

Patent Literature

PTL 1: JP-A-2007-141633
PTL 2: JP-A-2011-034744

SUMMARY OF INVENTION

Technical Problem

The inventors of the present specification have thoroughly examined a small-sized vacuum exhaust system cleanly realizing high-vacuum exhaust and low-vacuum exhaust and have concluded the following results.

In PTL 1, as illustrated in FIGS. 1 and 2, the degree of vacuum inside a sample chamber 10 is measured, a valve V4 is opened when the degree of vacuum is equal to or less than a predetermined degree of vacuum, a vacuum chamber is vacuum-exhausted by the oil rotary pump, and a high-vacuum mode rapidly transitions to a low-vacuum mode.

However, oil evaporating from the oil rotary pump performing preliminary exhaust inside the vacuum chamber flows to the sample chamber or the vacuum exhaust pipe and contaminates inside an apparatus such as a sample chamber or a vacuum exhaust pipe. By radiating an electron beam to an observation sample disposed inside the contaminated sample chamber, there is a possibility of the observation sample being contaminated. When the apparatus is used for a long time and the electron gun chamber is also contaminated, there is a possibility of the electron gun chamber not reaching predetermined high vacuum.

Even in PTL 2 which is an improvement invention of PTL 1, as illustrated in FIGS. 1 to 5, a vacuum chamber 7 and a second intermediate chamber 4 are preliminarily exhausted by an auxiliary vacuum pump 11 to shorten an exhaust time and an improvement in a throughput from sample exchange to low-vacuum observation is achieved. Therefore, oil evaporating from the oil rotary pump performing the preliminary exhaust of the vacuum chamber contaminates inside the apparatus.

On the other hand, a method of preventing contamination inside the apparatus by using a dry pump as the auxiliary vacuum pump is considered. However, an installation space of the dry pump is generally greater than the oil rotary pump and there is the disadvantageous effect such as high cost.

An object of the invention is to perform high-vacuum exhaust and low-vacuum exhaust without contaminating inside an apparatus.

Solution to Problem

The invention relates to vacuum-exhaust of a charged particle gun chamber and a sample chamber through a main inlet port of a turbo molecular pump at the time of performing high-vacuum exhaust and vacuum-exhausting the sample chamber through an intermediate inlet port of the turbo molecular pump while vacuum-exhausting the charged particle gun chamber through the main inlet port at the time of performing low-vacuum exhaust. The invention relates to an oil rotary pump that does not vacuum exhaust the charged particle gun chamber or the sample chamber.

Advantageous Effects of Invention

According to the invention, since contamination inside the apparatus can be prevented in either high-vacuum exhaust or low-vacuum exhaust, contamination of an observation sample can be prevented, and thus it is possible to reduce deterioration in ultimate vacuum over time.

DESCRIPTION OF EMBODIMENTS

First Embodiment

Figure 1:
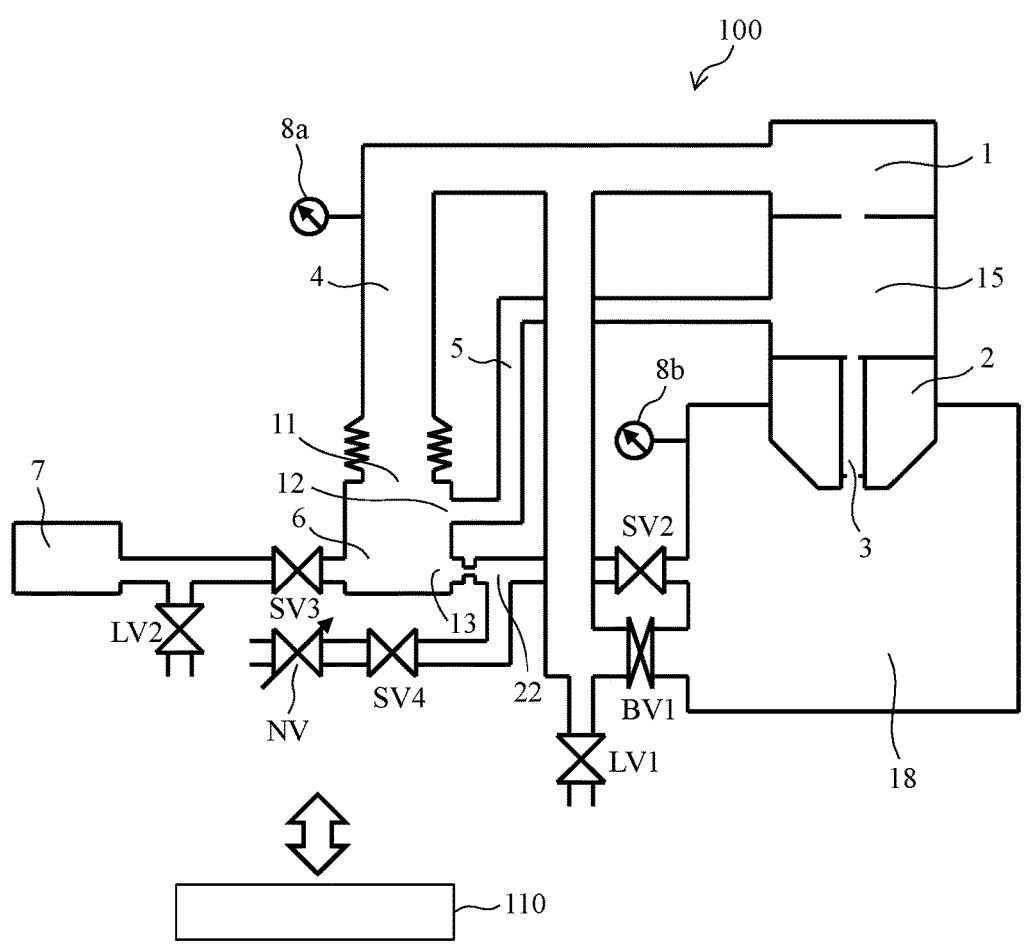
FIG. 1 is a side view illustrating a configuration of a charged particle beam apparatus 100 according to a first embodiment.

FIG. 1 is a side view illustrating a configuration of a charged particle beam apparatus 100 according to the present embodiment. The charged particle beam apparatus 100 includes a charged particle gun chamber 1, an intermediate chamber 15, and an objective lens 2, and a sample chamber 18. The charged particle gun chamber 1 accommodates a charged particle source radiating a charged particle beam to a sample. The intermediate chamber 15 accommodates an electron optical system and the charged particle beam radiated from the charged particle gun chamber 1 to the sample passes. The objective lens 2 narrows the charged particle beam thinly and radiates the thinly narrowed charged particle beam to the sample. The sample chamber 18 accommodates the sample. The objective lens 2 includes an orifice 3 that restricts an amount of gas blowing from the sample chamber 18 since differential exhaust is performed between the sample chamber 18 and the intermediate chamber 15. The charged particle gun chamber 1, the intermediate chamber 15, and the sample chamber 18 are vacuum-exhausted by a composite turbo molecular pump 6.

The composite turbo molecular pump 6 includes a main inlet port 11, a first intermediate inlet port 13, and a second intermediate inlet port 12. In the composite turbo molecular pump 6, the degree of vacuum is lower as a distance is away from the main inlet port 11. The first intermediate inlet port 13 is located to be more distant from the main inlet port 11 than the second intermediate inlet port 12, and thus has the degree of vacuum lower than the second intermediate inlet port 12. The second intermediate inlet port 12 is located to be closer to the main inlet port 11 than the first intermediate inlet port 13, and thus has the degree of vacuum lower than the main inlet port 11 and the degree of vacuum higher than the first intermediate inlet port 13. In other words, the main inlet port 11 has the highest degree of vacuum, the first intermediate inlet port 13 has the lowest degree of vacuum, and the second intermediate inlet port has the degree of vacuum between the degrees of vacuum.

The charged particle gun chamber 1 is connected to the main inlet port 11 of the composite turbo molecular pump 6 via a vacuum exhaust pipe 4. In the vacuum exhaust pipe 4, a vacuum gauge 8a is disposed to monitor the degree of vacuum of the charged particle gun chamber 1. The sample chamber 18 is connected to the main inlet port 11 via an exhaust pipe branched from the vacuum exhaust pipe 4. The sample chamber 18 is further connected to the first intermediate inlet port 13 of the composite turbo molecular pump 6 via a vacuum exhaust pipe 22. The intermediate chamber 15 is connected to the second inlet port 12 of the composite turbo molecular pump 6 via a vacuum exhaust pipe 5. A vacuum gauge 8b monitors the degree of vacuum of the sample chamber 18.

A variable flow valve NV adjusts an amount of gas introduced to the sample chamber 18 to vary the degree of vacuum of the sample chamber 18. The variable flow valve NV is connected to the sample chamber 18 via an exhaust pipe branched from the vacuum exhaust pipe 22.

A valve BV1 opens and closes an exhaust pipe between the sample chamber 18 and the main inlet port 11. A valve SV2 opens and closes the vacuum exhaust pipe 22. A valve SV3 opens and closes an exhaust pipe between an exhaust port of the composite turbo molecular pump 6 and an auxiliary vacuum pump 7. A valve SV4 opens and closes between the sample chamber 18 and the variable flow valve NV A leak valve LV1 exposes the charged particle gun chamber 1, the intermediate chamber 15, and the sample chamber 18 to the atmosphere. A leak valve LV2 exposes a back pressure exhaust side of the composite turbo molecular pump 6 to the atmosphere.

The auxiliary vacuum pump 7 is connected to the back pressure exhaust side of the composite turbo molecular pump 6 and performs back pressure exhaust of the composite turbo molecular pump 6. The auxiliary vacuum pump 7 can be configured using, for example, a relatively cheap pump such as an oil rotary pump.

A control unit 110 controls an operation of the entire charged particle beam apparatus 100, such as each value, each pump, and an electron optical system. The control unit 110 can be configured using, for example, an arithmetic device such as a microcomputer or a central processing unit (CPU).

To necessarily maintain the pressure of the charged particle gun chamber 1 as low as possible, the diameter of the vacuum exhaust pipe 4 connected to the main inlet port 11 of the composite turbo molecular pump 6 is set to be large, and thus conductance is improved. Thus, low ultimate pressure is obtained.

The sample chamber 18 accommodates many components such as a sample stage on which a sample is mounted and which moves observation visual field and a detector which detects a signal from an observation sample. Therefore, since the sample chamber 18 has a relatively large volume than the charged particle gun chamber 1 or the intermediate chamber 15, the diameter of the exhaust pipe branched from the vacuum exhaust pipe 4 and connected to the sample chamber 18 is set to be large, and thus conductance is improved. Thus, an exhaust time is shortened and low ultimate pressure is obtained.

Differential exhaust throttles are disposed between the charged particle gun chamber 1 and the intermediate chamber 15 and between the intermediate chamber 15 and the sample chamber 18. When the sample chamber 18 is in a low-vacuum state, a gas blows from the sample chamber 18 to the intermediate chamber 15 via the orifice 3. By exhausting the intermediate chamber 15 via the second intermediate inlet port 12, it is possible to prevent the gas from blowing from the intermediate chamber 15 to the charged particle gun chamber 1. Thus, the charged particle gun chamber 1 is maintained in a high-vacuum state. To perform differential exhaust, the diameter of the vacuum exhaust pipe 5 is set to be less than the diameter of the vacuum exhaust pipe 4.

Since the pressure of the sample chamber 18 is higher than the pressure of the charged particle gun chamber 1 or the pressure of the intermediate chamber 15, the sample chamber 18 is connected to the first intermediate inlet port 13 distant from the main inlet port 11. Thus, the charged particle gun chamber 1 is maintained in the high-vacuum state. The vacuum exhaust pipe 22 is used for a low-vacuum exhaust sequence to be described below. Therefore, by setting the diameter of a portion connecting the vacuum exhaust pipe 22 to the first intermediate inlet port 13 to be less than the diameter of the vacuum exhaust pipe 5, conductance is smaller than in the other exhaust pipes.

When high-vacuum observation is performed, the control unit 110 opens the valves BV1 and SV3 and closes the valves SV2, SV4, LV1, LV2, and NV. As a result, the charged particle gun chamber 1 and the sample chamber 18 are exhausted via the main inlet port 11 of the composite turbo molecular pump 6 and the intermediate chamber 15 is exhausted via the second intermediate inlet port 12 of the composite turbo molecular pump 6. The intermediate chamber 15 is at a position at which a charged particle beam radiated from the charged particle gun chamber 1 to the sample chamber 18 passes, and thus an influence of the degree of vacuum herein on observation is relatively small. Accordingly, the intermediate chamber 15 is exhausted through the second intermediate inlet port 12 and the volume exhausted through the main inlet port 11 is decreased to that extent and the exhaust time of the charged particle gun chamber 1 and the sample chamber 18 is shortened.

Figure 2:
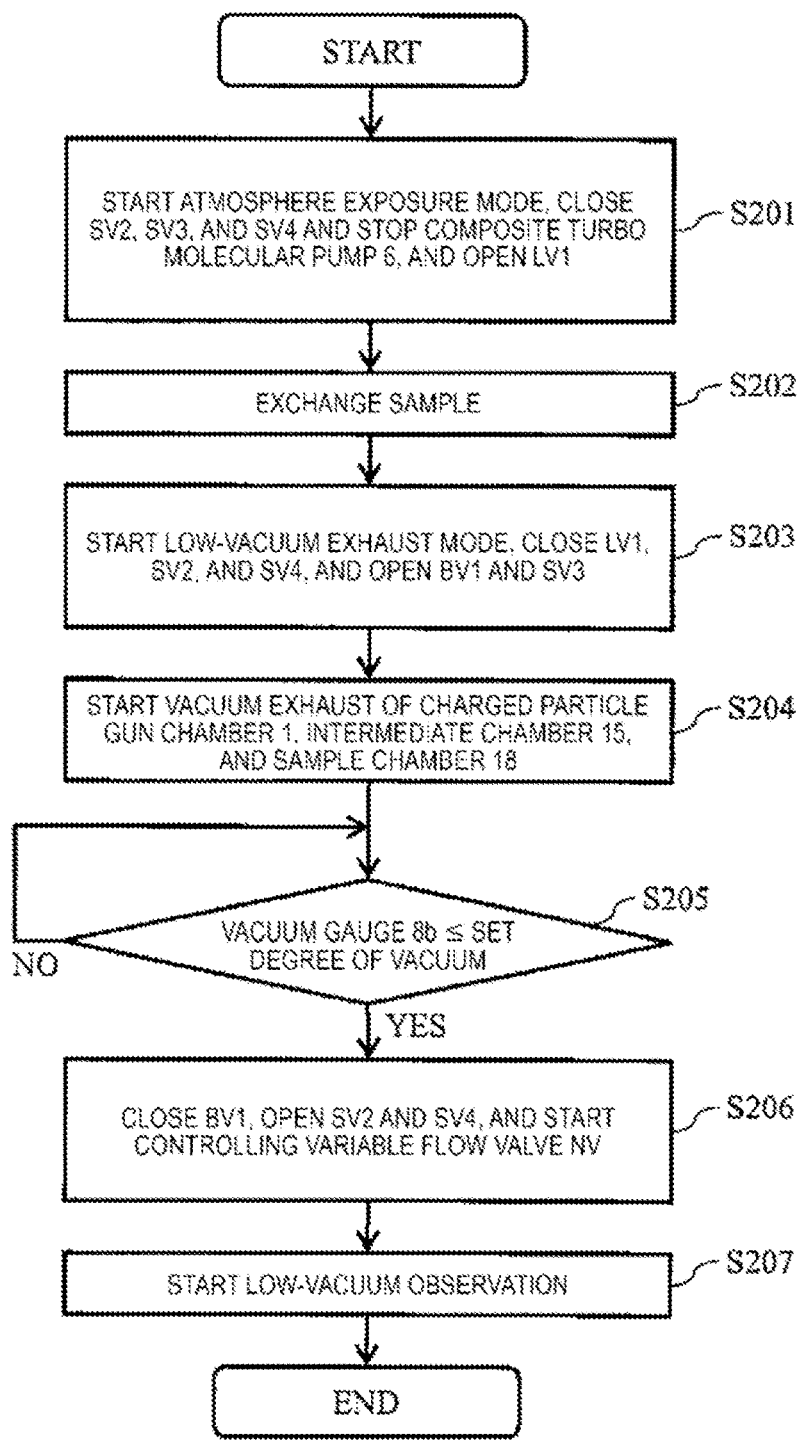
FIG. 2 is a flowchart illustrating exhaust sequence control when the charged particle beam apparatus 100 performs low-vacuum observation.

FIG. 2 is a flowchart illustrating exhaust sequence control when the charged particle beam apparatus 100 performs low-vacuum observation. Hereinafter steps of FIG. 2 will be described.

(FIG. 2: Step S201)

The control unit 110 starts an atmosphere exposure mode. In the atmosphere exposure mode, the control unit 110 first closes the valves SV2, SV3, and SV4 and stops the composite turbo molecular pump 6. Thereafter, the control unit 110 opens the leak valve LV1 to expose the charged particle gun chamber 1, the intermediate chamber 15, and the sample chamber 18 to the atmosphere.

(FIG. 2: Step S202)

After a user exchanges a sample inside the sample chamber 18, the control unit 110 starts a low-vacuum exhaust mode to be described below (FIG. 2: Steps S203 to S205)

The control unit 110 closes the valves LV1, SV2, and SV4 and opens the valves BV1 and SV3 (S203). The control unit 110 starts exhausting the charged particle gun chamber 1, the intermediate chamber 15, and the sample chamber 18 using the composite turbo molecular pump 6 (S204). The control unit 110 continues the exhaust until a value by measured by the vacuum gauge 8b reaches a preset degree of vacuum, for example, 500 Pa (S205).

(FIG. 2: Step S204: Supplement)

In this step, the charged particle gun chamber 1 and the sample chamber 18 are exhausted via the main inlet port 11 and the intermediate chamber 15 is exhausted via the second intermediate inlet port 12.

(FIG. 2: Step S206)

When the set degree of vacuum is obtained, the control unit 110 first closes the valve BV1. The control unit 110 subsequently opens the valve SV2 and exhausts the sample chamber 18 via the first intermediate inlet port 13 of the composite turbo molecular pump 6. The control unit 110 subsequently opens the valve SV4 and starts controlling the variable flow valve NV. The control unit 110 adjusts the degree of vacuum of the sample chamber 18 using the variable flow valve NV. The control unit 110 may normally read a value of the vacuum gauge 8b so that a flow rate of the variable flow valve NV is automatically controlled. The pressure inside the sample chamber 18 can be minutely adjusted together with the exhaust via the variable flow valve NV and the first intermediate inlet port 13.

(FIG. 2: Step S207)

The user starts low-vacuum observation of the sample at a time point at which the degree of vacuum of the sample chamber 18 reaches a desired low degree of vacuum. At the time of the low-vacuum observation, the pressure of the sample chamber 18 is adjusted in step S206 so that the pressure of the sample chamber 18 is, for example, 1 to 270 Pa.

The charged particle beam apparatus 100 according to the present embodiment exhausts the sample chamber 18 via the first intermediate inlet port 13 of the composite turbo molecular pump 6 when the low-vacuum exhaust is performed. Thus, even in a case in which the oil rotary pump is used as the auxiliary vacuum pump 7, it is possible to prevent the oil evaporating from the oil rotary pump from flowing inside the charged particle beam apparatus 100 (the sample chamber 18, the charged particle gun chamber 1, the electron optical system, and the like). As a result, it is possible to prevent the inside of the charged particle beam apparatus 100 or the observation sample from being contaminated, and thus it is possible to perform clearer vacuum exhaust than in the related art.

In the present embodiment, the intermediate chamber 15 is normally exhausted by the second intermediate inlet port 12. Thus, high-vacuum exhaust can be performed in a short time and the intermediate chamber 15 may not have a valve opening and closing the second intermediate inlet port 12, and thus there is the advantageous effect of miniaturizing an exhaust system.

In the first embodiment, the composite turbo molecular pump 6 is stopped at the time of exchanging a sample. Thus, since a value maintaining the vacuum of the composite turbo molecular pump 6 is not necessary, there is the advantageous effect of miniaturizing an exhaust system.

Second Embodiment

Figure 3:
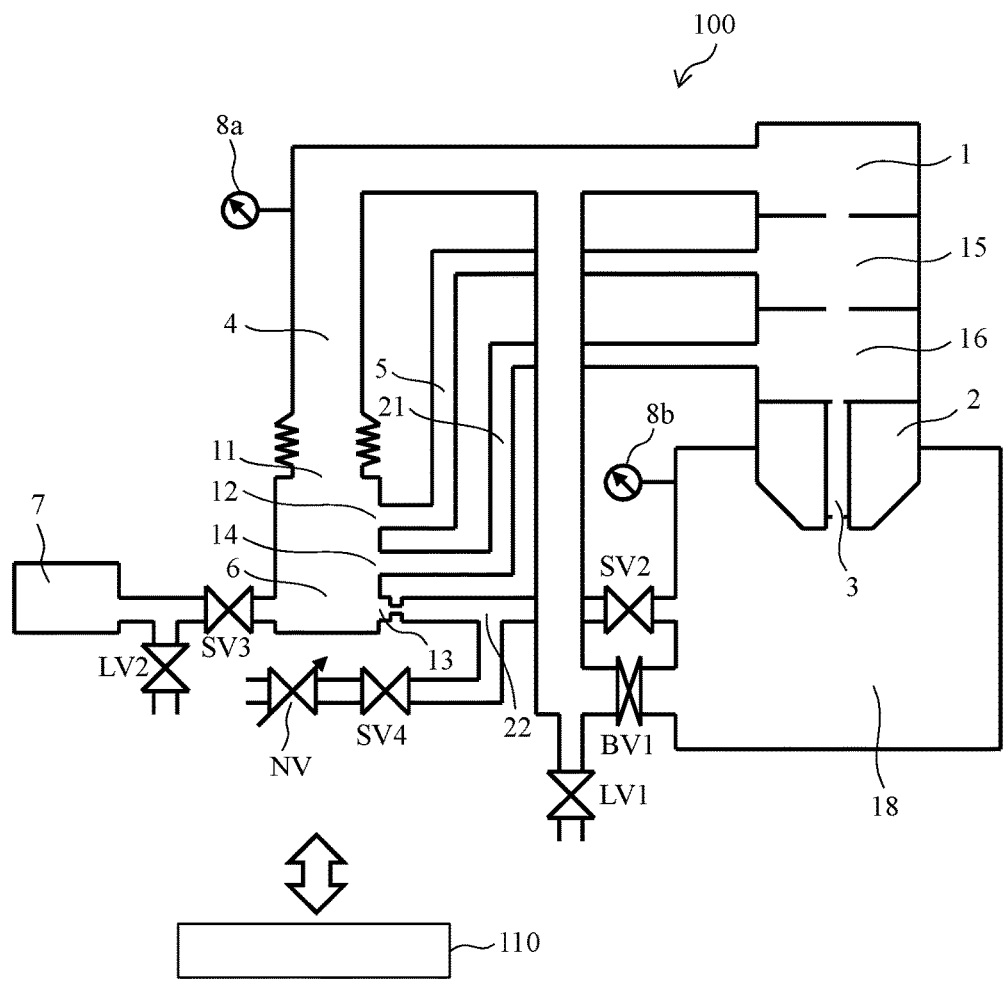
FIG. 3 is a side view illustrating a configuration of a charged particle beam apparatus 100 according to a second embodiment.

FIG. 3 is a side view illustrating a configuration of a charged particle beam apparatus 100 according to the present embodiment. The charged particle beam apparatus 100 according to the present embodiment includes a second intermediate chamber 16 and a vacuum exhaust pipe 21 in addition to the configuration described in the first embodiment. The composite turbo molecular pump 6 includes a third intermediate inlet port 14 in addition to the configuration described in the first embodiment. The third intermediate inlet port 14 is at a position closer to the main inlet port 11 than the first intermediate inlet port 13 and is at the position distant from the main inlet port 11 than the second intermediate inlet port 12. That is, the third intermediate inlet port 14 has the degree of vacuum between the first intermediate inlet port 13 and the second intermediate inlet port 12. The vacuum exhaust pipe 21 connects the second intermediate chamber 16 to the third intermediate inlet port 14. An orifice for performing differential exhaust is formed between the intermediate chamber 15 and the second intermediate chamber 16. The other remaining configuration is the same as that of the first embodiment.

The second intermediate chamber 16 can be exhausted together with the intermediate chamber 15 via the third intermediate inlet port 14. To improve a differential exhaust effect, the diameter of the vacuum exhaust pipe 21 can be set to be less than, for example, the diameter of the vacuum exhaust pipe 5 and greater than the diameter of a portion of the vacuum exhaust pipe 22 connected to the first intermediate inlet port 13.

The charged particle beam apparatus 100 according to the embodiment includes the plurality of intermediate chambers, and thus can perform the differential exhaust along a path reaching from the sample chamber 18 to the charged particle gun chamber 1. Thus, it is possible to maintain the degree of vacuum of the charged particle gun chamber 1 more highly while having the same advantageous effects as those of the first embodiment.

Third Embodiment

Figure 4:
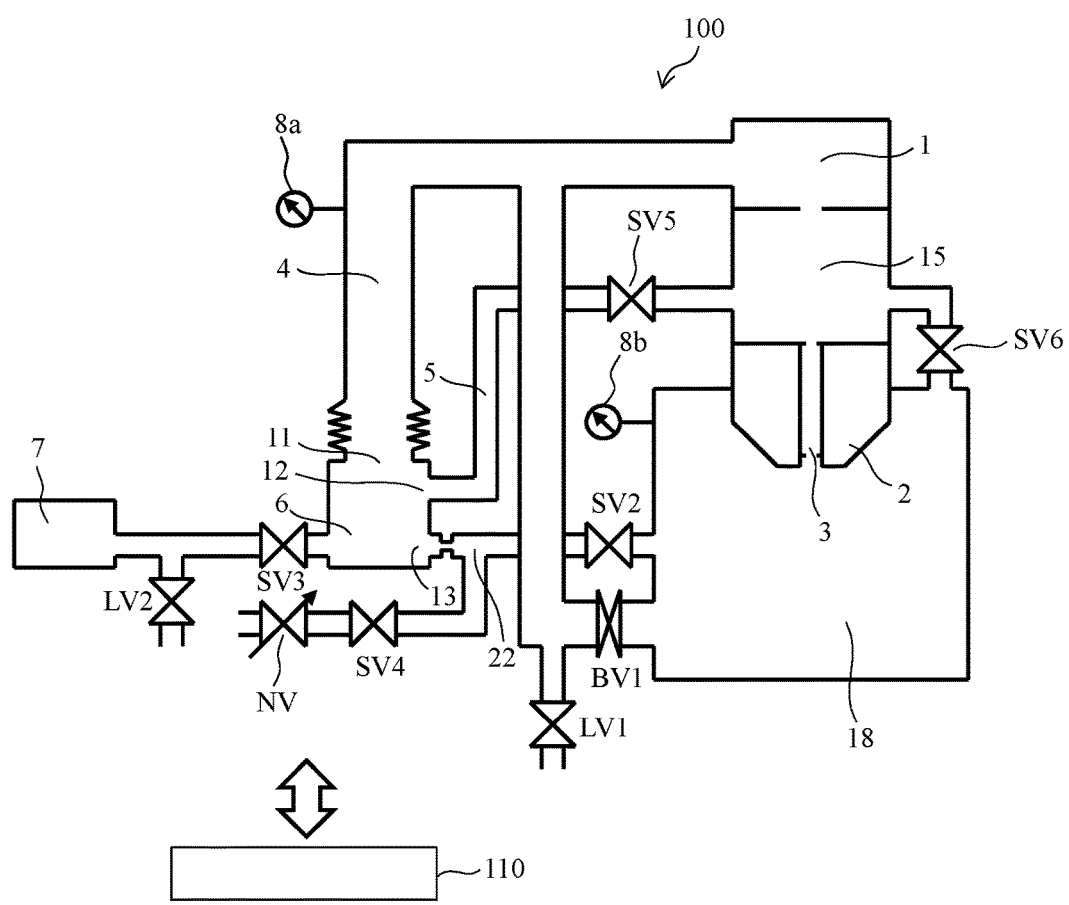
FIG. 4 is a side view illustrating a configuration of a charged particle beam apparatus 100 according to a third embodiment.

FIG. 4 is a side view illustrating a configuration of a charged particle beam apparatus 100 according to the present embodiment. The charged particle beam apparatus 100 according to the present embodiment includes a bypass pipe connecting the intermediate chamber 15 to the sample chamber 18 in addition to the configuration described in the first embodiment. The charged particle beam apparatus 100 further includes a valve SV5 that opens and closes the vacuum exhaust pipe 5 and a valve SV6 that opens and closes the bypass pipe. The other remaining configuration is the same as that of the first embodiment.

To perform high-vacuum observation in the present embodiment, the control unit 110 opens the values BV1, SV3, and SV6 and closes the valves SV2, SV4, SV5, LV1, LV2, and NV As a result, the charged particle gun chamber 1 and the sample chamber 18 are exhausted via the main inlet port 11, and the intermediate chamber 15 is similarly exhausted through the main inlet port 11 via the bypass pipe and the sample chamber 18.

To perform low-vacuum observation in the present embodiment, after performing steps S201 to S205, the control unit 110 closes the valves BV1 and SV6 and opens the valves SV2 and SV5 to exhaust the sample chamber 18 via the first intermediate inlet port 13 and exhaust the intermediate chamber 15 via the second intermediate inlet port 12. Thereafter, the control unit 110 adjusts the degree of vacuum of the sample chamber 18 using the variable flow valve NV as in the first embodiment. The subsequent procedure is the same as that of the first embodiment.

The charged particle beam apparatus 100 according to the present embodiment exhausts the intermediate chamber 15 through the main inlet port 11 via the bypass pipe and the sample chamber 18 at the time of the high-vacuum observation. Therefore, it is possible to further improve the degree of vacuum of the intermediate chamber 15 than in the first embodiment. Since the volume of the intermediate chamber 15 is less than the volume of the sample chamber 18, an influence of deterioration in the degree of vacuum due to an increase in the volume is small and the degree of vacuum of the sample chamber 18 is rarely changed. Accordingly, in a preferable use, it is particularly useful to improve the degree of vacuum of the intermediate chamber 15.

A bypass pipe connected to the charged particle gun chamber 1 may be included instead of the bypass pipe connected to the sample chamber 18 to exhaust the intermediate chamber 15 via the charged particle gun chamber 1. Since the charged particle gun chamber 1 has a volume less than the sample chamber 18 and a total volume of the charged particle gun chamber 1 and the intermediate chamber 15 is small, it is possible to further improve the degree of vacuum of the intermediate chamber 15.

Fourth Embodiment

Figure 5:
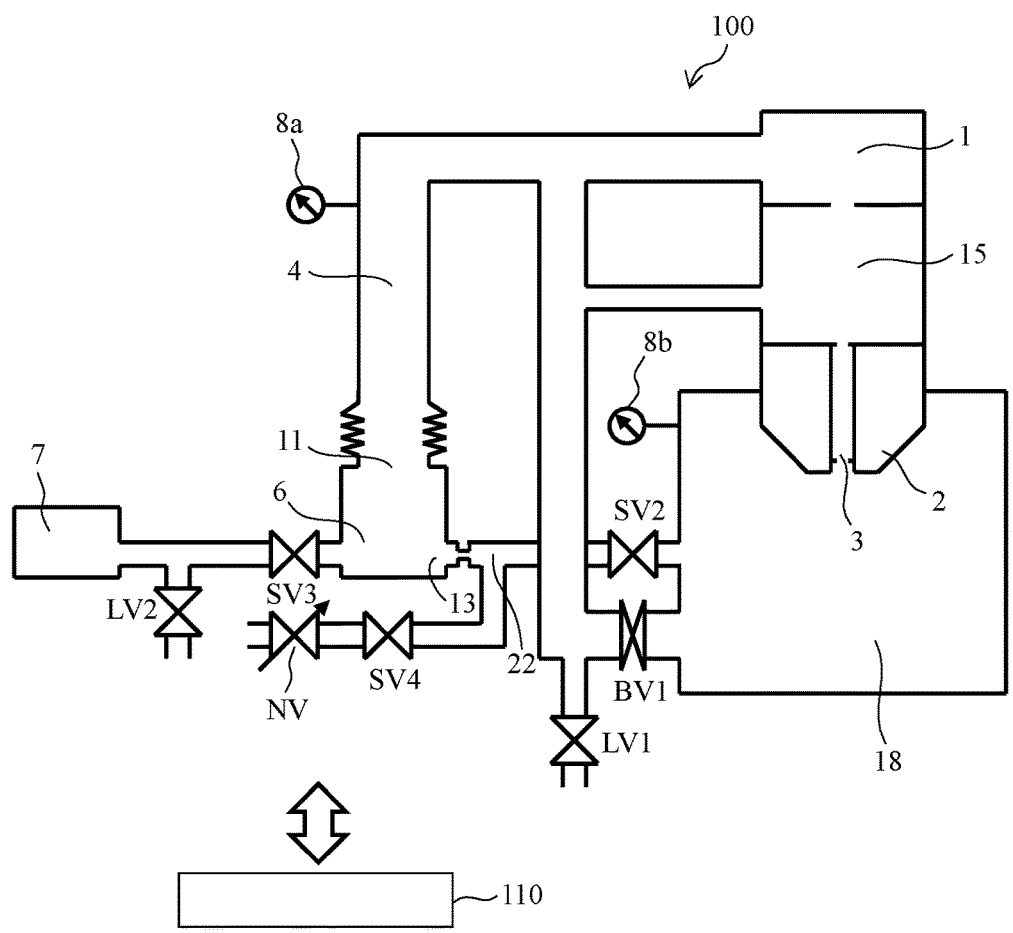
FIG. 5 is a side view illustrating a configuration of a charged particle beam apparatus 100 according to a fourth embodiment.

FIG. 5 is a side view illustrating a configuration of a charged particle beam apparatus 100 according to the present embodiment. In the charged particle beam apparatus 100 according to the present embodiment, the composite turbo molecular pump 6 does not include the second intermediate inlet port 12 described in the first embodiment. An exhaust pipe branched from the vacuum exhaust pipe 4 (or the exhaust pipe connecting the vacuum exhaust pipe 4 to the sample chamber 18) connects the intermediate chamber 15 to the composite turbo molecular pump 6. The other remaining configuration is the same as that of the first embodiment.

An operation of the charged particle beam apparatus 100 according to the present embodiment is the same as that of the first embodiment. In the present embodiment, however, the second intermediate inlet port 12 is not included. Therefore, in either the time of high-vacuum observation or the time of low-vacuum observation, the intermediate chamber 15 is exhausted via the main inlet port 11 of the composite turbo molecular pump 6. In the fourth embodiment, since the second intermediate inlet port 12 is not included, there is the advantageous effect of simplifying the structure of the composite turbo molecular pump 6.

Fifth Embodiment

Figure 6:
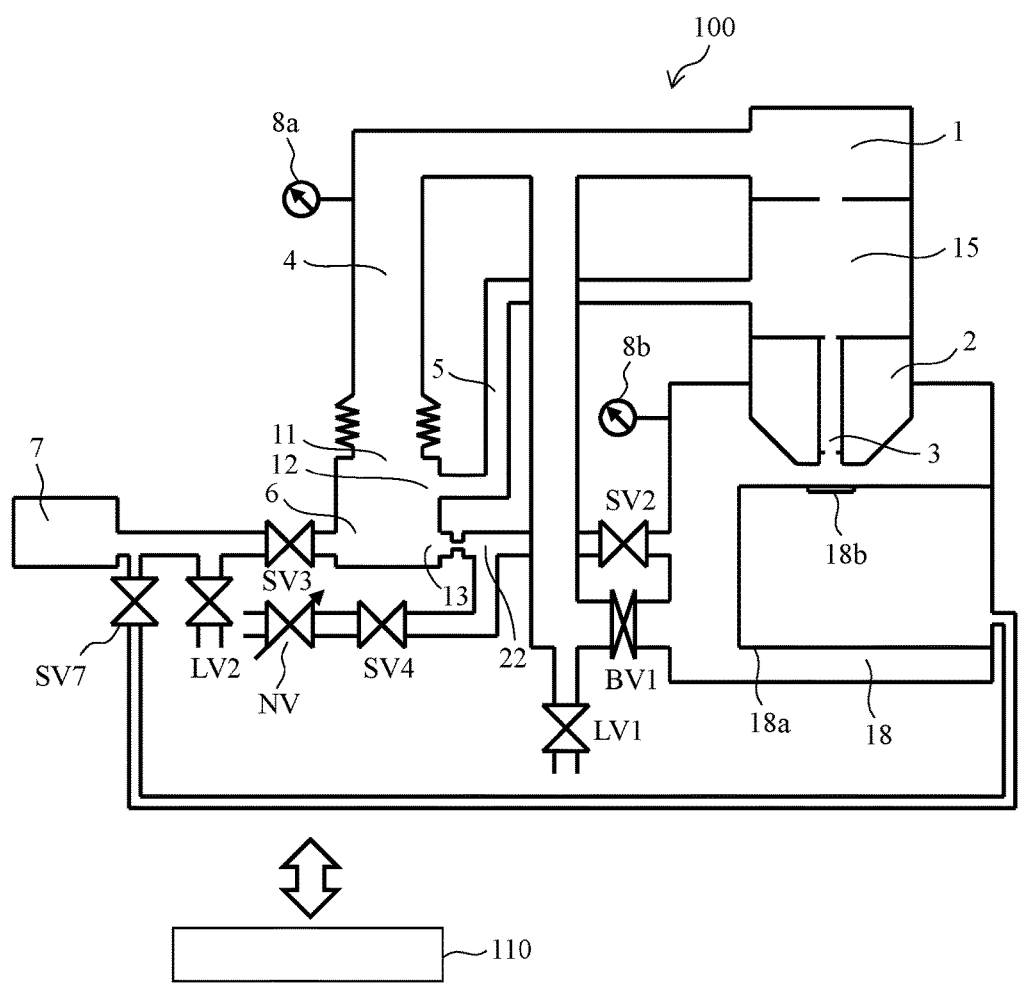
FIG. 6 is a side view illustrating a configuration of a charged particle beam apparatus 100 according to a fifth embodiment.

FIG. 6 is a side view illustrating a configuration of a charged particle beam apparatus 100 according to the present embodiment. The charged particle beam apparatus 100 according to the present embodiment includes a second sample chamber 18a inside the sample chamber 18. A thin film 18b is disposed between the sample chamber 18 and the second sample chamber 18a. The thin film 18b is configured to pass a charged particle beam emitted from the charged particle gun chamber 1 and also have a role of separating vacuum states of the sample chamber 18 and the second sample chamber 18a from each other.

In the present embodiment, to observe a sample, the sample is disposed inside the second sample chamber 18a, the sample chamber 18 is vacuum-exhausted, and the second sample chamber 18a is exposed to the atmosphere. For example, in a case in which the sample is damaged under the vacuum atmosphere, the sample can be observed using the second sample chamber 18a (for example, JP-A-2012-221766).

The second sample chamber 18a can also be depressurized (or vacuum-exhausted) as necessary. In this case, for example, the second sample chamber 18a is connected to the auxiliary vacuum pump 7 via an exhaust pipe and a valve SV7 opening and closing the exhaust pipe is included. By opening and closing the valve SV7, it is possible to select whether the second sample chamber 18a is depressurized.

<Modification Example of the Invention>

The invention is not limited to the foregoing embodiments and includes various modification examples. The foregoing embodiments have been described in detail to easily describe the invention and are not necessarily limited to having all of the described configurations. A part of the configuration of a certain embodiment can be substituted with the configuration of another embodiment. The configuration of another embodiment can also be added to the configuration of a certain embodiment. Another configuration can also be added, deleted, or replaced for part of the configuration of each embodiment.

In the foregoing embodiments, the configuration example of the low-vacuum scanning electron microscope observing a sample under the vacuum environment (or the atmospheric pressure) has been described. However, even when the sample chamber is vacuum-exhausted in a scanning transmission electron microscope, a transmission electron microscope, or a focused ion beam apparatus, the same configurations can be used.

REFERENCE SIGNS LIST 1 charged particle gun chamber
2 objective lens
3 orifice
4, 5 vacuum exhaust pipe
6 composite turbo molecular pump
7 auxiliary vacuum pump
8a, 8b vacuum gauge
11 main inlet port
12 second intermediate inlet port
13 first intermediate inlet port
14 third intermediate inlet port
15 intermediate chamber
16 second intermediate chamber
18 sample chamber
18a second sample chamber
18b thin film
21, 22 vacuum exhaust pipe 100 charged particle beam apparatus
BV1, SV1 to SV7 valve
NV variable flow valve

The invention claimed is:
1. A charged particle beam apparatus comprising:
a charged particle gun chamber that accommodates a charged particle source radiating a charged particle beam to a sample;
a sample chamber in which the sample is disposed;
a turbo molecular pump that vacuum-exhausts the charged particle gun chamber and the sample chamber;
a first exhaust pipe that connects a main inlet port of the turbo molecular pump to the charged particle gun chamber;
a second exhaust pipe that connects an intermediate inlet port of the turbo molecular pump to the sample chamber;
a third exhaust pipe that connects the sample chamber to the first exhaust pipe;
a first valve that opens and closes the second exhaust pipe;
a second valve that opens and closes the third exhaust pipe;
a fourth exhaust pipe that connects a second intermediate inlet port at a position closer to the main inlet port than the intermediate inlet port in the turbo molecular pump to an intermediate chamber connecting the charged particle gun chamber to the sample chamber;
a third valve that opens and closes the fourth exhaust pipe; and
a bypass pipe that connects the sample chamber to the intermediate chamber via an external connection between the sample chamber and the intermediate chamber.

2. The charged particle beam apparatus according to claim 1, further comprising:
an oil rotary pump that performs back pressure exhaust of the turbo molecular pump,
wherein the oil rotary pump does not vacuum-exhaust the charged particle gun chamber or the sample chamber.

3. The charged particle beam apparatus according to claim 2, further comprising:
a control unit that controls the first valve, the second valve, and the turbo molecular pump,
wherein when the sample chamber is exhausted to a high degree of vacuum higher than a predetermined degree of vacuum, the control unit closes the first valve and opens the second valve, and then vacuum-exhausts the charged particle gun chamber and the sample chamber through the main inlet port of the turbo molecular pump, and
wherein when the sample chamber is exhausted to a low degree of vacuum lower than the predetermined degree of vacuum, the control unit opens the first valve and closes the second valve, and then vacuum-exhausts the charged particle gun chamber through the main inlet port of the turbo molecular pump and vacuum-exhausts the sample chamber through the intermediate inlet port.

4. The charged particle beam apparatus according to claim 3,
wherein when the sample chamber is exhausted to the low degree of vacuum lower than the predetermined degree of vacuum, the control unit closes the first valve and opens the second valve, and then performs preliminary exhaust of the sample chamber through the main inlet port of the turbo molecular pump, and subsequently opens the first valve and closes the second valve, and then vacuum-exhausts the sample chamber through the intermediate inlet port of the turbo molecular pump.

5. The charged particle beam apparatus according to claim 1,
wherein a diameter of a portion connecting the first exhaust pipe to the main inlet port is set to be greater than a diameter of a portion connecting the fourth exhaust pipe to the second intermediate inlet port, and
wherein the diameter of the portion connecting the fourth exhaust pipe to the second intermediate inlet port is set to be greater than a diameter of a portion connecting the second exhaust pipe to the intermediate inlet port.

6. The charged particle beam apparatus according to claim 2, further comprising:
a fourth exhaust pipe that connects an intermediate chamber connecting the charged particle gun chamber to the sample chamber to the first exhaust pipe.

7. The charged particle beam apparatus according to claim 2, further comprising:
a second sample chamber in which the sample is disposed inside the sample chamber,
wherein in the second sample chamber, a film transmitting a charged particle beam radiated to the sample and separating a vacuum state of the second sample chamber from a vacuum state of the sample chamber is disposed.

8. The charged particle beam apparatus according to claim 3, further comprising:
a fifth exhaust pipe which is branched from the second exhaust pipe; and
a variable flow valve that adjusts a flow rate of a fluid flowing through the fifth exhaust pipe.

9. An exhaust method of vacuum-exhausting a charged particle gun chamber and a sample chamber of a charged particle beam apparatus, the charged particle beam apparatus including:
the charged particle gun chamber that accommodates a charged particle source radiating a charged particle beam to a sample;
the sample chamber in which the sample is disposed;
a turbo molecular pump that vacuum-exhausts the charged particle gun chamber and the sample chamber;
a first exhaust pipe that connects a main inlet port of the turbo molecular pump to the charged particle gun chamber;
a second exhaust pipe that connects an intermediate inlet port of the turbo molecular pump to the sample chamber;
a third exhaust pipe that connects the sample chamber to the first exhaust pipe;
a first valve that opens and closes the second exhaust pipe;
a second valve that opens and closes the third exhaust pipe;
a fourth exhaust pipe that connects a second intermediate inlet port at a position closer to the main inlet port than the intermediate inlet port in the turbo molecular pump to an intermediate chamber connecting the charged particle gun chamber to the sample chamber;
a third valve that opens and closes the fourth exhaust pipe; and
a bypass pipe that connects the sample chamber to the intermediate chamber via an external connection between the sample chamber and the intermediate chamber,
the exhaust method comprising:
blocking the intermediate inlet port of the turbo molecular pump and the sample chamber, then connecting the main inlet port of the turbo molecular pump to the charged particle gun chamber and the sample chamber, and vacuum-exhausting the charged particle gun chamber and the sample chamber through the main inlet port when the sample chamber is exhausted to a higher degree of vacuum than a predetermined degree of vacuum; and blocking the main inlet port and the sample chamber, then connecting the main inlet port to the sample chamber, further connecting the intermediate inlet port to the sample chamber, and vacuum-exhausting the sample chamber through the intermediate inlet port while vacuum-exhausting the charged particle gun chamber through the main inlet port when the sample chamber is exhausted to a lower degree of vacuum than the predetermined degree of vacuum.

10. The exhaust method according to claim 9,
wherein while an oil rotary pump performs back pressure exhaust of the turbo molecular pump, the oil rotary pump does not vacuum-exhaust the charged particle gun chamber or the sample chamber.

11. The exhaust method according to claim 10,
wherein when the sample chamber is exhausted to the lower degree of vacuum than the predetermined degree of vacuum, the intermediate inlet port and the sample chamber are blocked, the main inlet port is then connected to the charged particle gun chamber and the sample chamber, the sample chamber is preliminarily exhausted through the main inlet port, subsequently the main inlet port and the sample chamber are blocked, the intermediate inlet port is then connected to the sample chamber, and the sample chamber is vacuum-exhausted through the intermediate inlet port.

12. The exhaust method according to claim 10,
wherein the second intermediate inlet port at the position closer to the main inlet port than the intermediate inlet port in the turbo molecular pump is normally connected to the intermediate chamber connecting the charged particle gun chamber to the sample chamber, and the intermediate chamber is vacuum-exhausted through the second intermediate inlet port.

13. The exhaust method according to claim 10,
wherein when the sample chamber is exhausted to the higher degree of vacuum than the predetermined degree of vacuum, the second intermediate inlet port at the position closer to the main inlet port than the intermediate inlet port in the turbo molecular pump and the intermediate chamber connecting the charged particle gun chamber to the sample chamber are blocked, the charged particle gun chamber or the sample chamber is then connected to the intermediate chamber, and the intermediate chamber is vacuum-exhausted through the main inlet port, and wherein when the sample chamber is exhausted to the lower degree of vacuum than the predetermined degree of vacuum, the charged particle gun chamber or the sample chamber and the intermediate chamber are blocked, the second intermediate inlet port is then connected to the sample chamber, and the intermediate chamber is vacuum-exhausted through the second intermediate inlet port.

14. The exhaust method according to claim 10,
wherein the intermediate chamber connecting the charged particle gun chamber to the sample chamber is normally connected to the main inlet port and the intermediate chamber is vacuum-exhausted through the main inlet port.

15. The exhaust method according to claim 10,
wherein a second sample chamber separated from a vacuum state of the sample chamber is connected to the oil rotary pump and the second sample chamber is depressurized or vacuum-exhausted by the oil rotary pump.

16. The exhaust method according to claim 10,
wherein when the sample chamber is exhausted to the lower degree of vacuum than the predetermined degree of vacuum, a flow rate of a fluid flowing in the sample chamber is adjusted by a variable flow valve.

\* \* \* \* \*